United States Patent
Alley et al.

(10) Patent No.: US 11,716,178 B2
(45) Date of Patent: *Aug. 1, 2023

(54) SAFETY RATED INPUT MODULE FOR AN INDUSTRIAL CONTROLLER

(71) Applicant: Rockwell Automation Technologies, Inc., Mayfield Heights, OH (US)

(72) Inventors: Daniel M. Alley, Earlysville, VA (US); John R. O'Connell, Painesville, OH (US); Jared Bell, Lakewood, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/970,929

(22) Filed: Oct. 21, 2022

(65) Prior Publication Data
US 2023/0039029 A1    Feb. 9, 2023

Related U.S. Application Data

(63) Continuation of application No. 17/005,983, filed on Aug. 28, 2020, now Pat. No. 11,496,254.

(51) Int. Cl.
*H04L 1/24* (2006.01)
*G05B 9/03* (2006.01)
(Continued)

(52) U.S. Cl.
CPC .............. *H04L 1/24* (2013.01); *G05B 9/03* (2013.01); *G05B 19/058* (2013.01); *H04L 1/22* (2013.01)

(58) Field of Classification Search
CPC ..... H04L 1/22; H04L 1/24; H04L 1/242–244; G05B 9/03; G05B 19/058; G05B 23/02;
(Continued)

(56) References Cited

U.S. PATENT DOCUMENTS 5,469,447 A * 11/1995 Brunemann, Jr. ....... G05B 9/03
                                                                714/797
6,252,411 B1 * 6/2001 Moore ................... G01R 23/16
                                                                324/615
(Continued)

FOREIGN PATENT DOCUMENTS

CN        104931760 A     9/2015
EP          3059559 A1    8/2016

OTHER PUBLICATIONS

Extended European Search Report dated Jan. 28, 2022; Application No. 21189460.5—(6) pages.
(Continued)

*Primary Examiner* — James M Perez
(74) *Attorney, Agent, or Firm* — Boyle Fredrickson, SC

(57) ABSTRACT

A system and method for detecting a failure in a redundant signal path during operation of the redundant path is disclosed. A test signal is sequentially injected into each signal path while an input signal is conducted by the other signal path not receiving the test signal. The test signal is selected at a frequency to verify operation of a filter connected in series along each path. A processor generates the test signal, injects the test signal at the input of the filter, and receives the output of the filter. The processor then generates a frequency response of the filter in each signal path as a function of the output from the filter and of the original test signal. The frequency response obtained along each of the redundant signal paths is compared to each other to detect a failure of one of the filters present along the respective signal paths.

20 Claims, 5 Drawing Sheets

(51) Int. Cl.
*G05B 19/05* (2006.01)
*H04L 1/22* (2006.01)

(58) Field of Classification Search
CPC .............. G05B 23/205; G05B 23/0218; G05B 23/0256–0262
See application file for complete search history.

(56) References Cited

U.S. PATENT DOCUMENTS

| | | | | |
|---|---|---|---|---|
| 6,329,807 B1* | 12/2001 | Wild | .................... | F02D 41/222 324/76.29 |
| 6,737,874 B2* | 5/2004 | Kim | .................... | G05B 9/03 324/613 |
| 6,760,302 B1* | 7/2004 | Ellinas | .................... | H04L 1/22 370/228 |
| 7,130,359 B2* | 10/2006 | Rahman | .................... | H03D 3/008 375/345 |
| 7,248,625 B2* | 7/2007 | Chien | .................... | H04B 17/20 375/219 |
| 7,487,060 B2* | 2/2009 | Oberle | .................... | G06F 7/026 702/179 |
| 7,593,205 B2* | 9/2009 | Veil | .................... | G05B 9/03 361/93.1 |
| 7,656,117 B2* | 2/2010 | Hoadley | .................... | H02M 1/126 318/807 |
| 7,733,949 B2* | 6/2010 | Jin | .................... | H04B 17/354 379/3 |
| 7,809,051 B2* | 10/2010 | Maucksch | .................... | H04L 1/24 375/240.26 |
| 7,965,478 B2* | 6/2011 | Haensgen | .................... | H02H 7/09 361/42 |
| 8,054,924 B2* | 11/2011 | Madhavan | .................... | H04L 25/0214 375/328 |
| 8,340,167 B2* | 12/2012 | Feng | .................... | H04B 17/21 375/325 |
| 8,373,406 B2* | 2/2013 | Ahmed | .................... | G01R 31/2839 324/119 |
| 8,665,938 B2* | 3/2014 | Yu | .................... | H04B 17/14 375/228 |
| 8,688,862 B1* | 4/2014 | Alley | .................... | G01R 31/3177 710/72 |
| 8,700,360 B2* | 4/2014 | Garimella | .................... | F02D 41/0072 701/108 |
| 8,806,085 B2* | 8/2014 | Mathason | .................... | G05B 19/054 710/36 |
| 9,203,448 B2* | 12/2015 | Morita | .................... | H03F 1/34 |
| 9,312,916 B2* | 4/2016 | Dardenne | .................... | H04M 11/066 |
| 9,345,441 B2* | 5/2016 | Wendler | .................... | A61B 1/307 |
| 9,346,441 B2* | 5/2016 | Rasbornig | .................... | G01D 3/08 |
| 9,444,515 B2* | 9/2016 | Khan | .................... | H04W 4/80 |
| 9,488,686 B2* | 11/2016 | Bhandarkar | .................... | G01R 31/64 |
| 9,558,054 B2* | 1/2017 | Wakuda | .................... | H04L 1/24 |
| 9,614,557 B1* | 4/2017 | Mayer | .................... | H04B 1/40 |
| 9,625,558 B2* | 4/2017 | You | .................... | G05B 9/03 |
| 9,651,592 B2* | 5/2017 | Kerkman | .................... | G01R 31/64 |
| 9,735,696 B2* | 8/2017 | Bhandarkar | .................... | H02M 5/4585 |
| 9,768,993 B2* | 9/2017 | Minami | .................... | H04L 1/242 |
| 9,774,419 B2* | 9/2017 | Kolze | .................... | H04L 1/208 |
| 9,780,891 B2* | 10/2017 | Eo | .................... | H04B 17/0085 |
| 9,893,924 B2* | 2/2018 | Smail | .................... | H04L 27/3881 |
| 10,027,358 B2* | 7/2018 | Wu | .................... | H03D 7/1466 |
| 10,057,795 B2* | 8/2018 | Starzer | .................... | H04W 24/06 |
| 10,128,962 B2* | 11/2018 | Dominizi | .................... | H04B 17/0085 |
| 10,278,084 B2* | 4/2019 | Starzer | .................... | H04B 1/16 |
| 10,374,838 B2* | 8/2019 | Jiang | .................... | H03F 3/245 |
| 10,469,109 B2* | 11/2019 | Gutman | .................... | H03F 3/24 |
| 10,601,415 B2* | 3/2020 | Norling | .................... | H03K 17/168 |
| 10,673,442 B2* | 6/2020 | Freidl | .................... | H03L 7/1976 |
| 10,778,260 B2* | 9/2020 | Wilhelmsson | ...... | H04L 27/2626 |
| 10,852,408 B2* | 12/2020 | Aslett | .................... | G01S 7/4056 |
| 10,901,045 B2* | 1/2021 | Weidner | .............. | H01M 10/425 |
| 11,025,052 B2* | 6/2021 | Roberts | .................... | H02M 1/32 |
| 11,057,123 B1* | 7/2021 | Chang | .................... | H04B 1/38 |
| 11,165,609 B2* | 11/2021 | Gao | .................... | H04L 25/0286 |
| 11,177,986 B1* | 11/2021 | Ganesan | .......... | H04L 25/03878 |
| 11,431,379 B1* | 8/2022 | Wadell | .................... | H04B 3/46 |
| 11,496,254 B2* | 11/2022 | Alley | .................... | H04L 1/24 |
| 2003/0034786 A1* | 2/2003 | Kim | .................... | G05B 9/03 324/613 |
| 2004/0013208 A1* | 1/2004 | Bui | .................... | H04L 1/24 375/232 |
| 2007/0047634 A1* | 3/2007 | Kang | .................... | H04B 17/101 375/281 |
| 2007/0123188 A1* | 5/2007 | Mo | .................... | H04B 1/30 455/302 |
| 2007/0182361 A1* | 8/2007 | Pande | .................... | H02P 1/029 318/812 |
| 2010/0213924 A1* | 8/2010 | Osumi | .............. | G01R 31/2836 324/76.44 |
| 2010/0328825 A1* | 12/2010 | Haensgen | ................ | H02H 7/09 361/47 |
| 2011/0025300 A1* | 2/2011 | Ahmed | .............. | G01R 31/2839 324/119 |
| 2011/0026570 A1* | 2/2011 | Feng | .................... | H04B 17/21 455/226.1 |
| 2011/0292696 A1* | 12/2011 | Xiao | .................... | H02M 5/4585 324/548 |
| 2012/0167665 A1* | 7/2012 | Garimella | .......... | G05B 23/0221 73/23.31 |
| 2013/0191681 A1* | 7/2013 | Moiseev | .................. | G05B 9/03 714/2 |
| 2013/0249720 A1* | 9/2013 | Matsuura | .............. | H03M 1/06 341/118 |
| 2013/0286692 A1* | 10/2013 | Patel | .................... | H02M 1/126 702/58 |
| 2013/0293217 A1* | 11/2013 | Moiseev | ............ | G05B 23/0227 324/76.77 |
| 2014/0047137 A1* | 2/2014 | Mathason | ............ | G05B 19/054 710/33 |
| 2014/0331109 A1* | 11/2014 | Wakuda | .................... | H04L 1/24 714/799 |
| 2015/0091582 A1* | 4/2015 | Wei | .................... | G01R 31/52 324/509 |
| 2015/0260822 A1* | 9/2015 | You | .................... | G05B 9/03 324/74 |
| 2015/0355259 A1* | 12/2015 | Sartler | .................. | H02M 1/126 324/548 |
| 2015/0355262 A1* | 12/2015 | Hu | .................... | B60L 3/0069 324/509 |
| 2016/0245909 A1* | 8/2016 | Aslett | .................... | G01S 7/4056 |
| 2017/0063489 A1* | 3/2017 | Kolze | .................... | H04B 17/318 |
| 2017/0149343 A1* | 5/2017 | Bhandarkar | .......... | H02M 5/458 |
| 2017/0353876 A1* | 12/2017 | Starzer | .................... | H04B 1/16 |
| 2018/0062768 A1* | 3/2018 | Frank | .................... | H04B 15/005 |
| 2018/0144603 A1* | 5/2018 | Bellingkrodt | ............ | G08B 5/36 |
| 2019/0107818 A1* | 4/2019 | Scherrer | .............. | G05B 19/058 |
| 2019/0229521 A1* | 7/2019 | Roberts | ................ | H02H 7/1222 |
| 2022/0038222 A1* | 2/2022 | Rasbornig | ......... | H04L 12/40006 |
| 2022/0069952 A1* | 3/2022 | Alley | .................... | G05B 19/056 |
| 2023/0039029 A1* | 2/2023 | Alley | .................... | G01R 31/2837 |

OTHER PUBLICATIONS

Kladovscikov et al.; "Design of an Oscillation-Based BIST System for Active Analog Integrated Filters in 0.18 um CMOS"; Vilnius, Lithuania—(19) pages.

* cited by examiner

SAFETY RATED INPUT MODULE FOR AN INDUSTRIAL CONTROLLER

CROSS-REFERENCE TO RELATED APPLICATIONS

This application is a continuation of and claims priority to U.S. application Ser. No. 17/005,983, filed Aug. 28, 2020, the entire contents of which is incorporated herein by reference path.

BACKGROUND INFORMATION

The subject matter disclosed herein relates to detecting a fault within a filter path. More specifically, a system and method are disclosed to determine a faulted component within a filter, where the filter is located in a redundant signal path.

Industrial controllers are special-purpose computers used in controlling industrial machines or processes. Under the direction of a stored control program, an industrial controller examines a series of inputs reflecting the status of the controlled machine or process and changes a series of outputs controlling the machine or process. The inputs and outputs may be binary, that is, on or off, or analog, providing a value within a substantially continuous range. The inputs may be obtained from sensors attached to the controlled process, and the outputs may be signals to actuators on the controlled process.

"Safety industrial control systems" are industrial control systems intended to ensure the safety of humans working in the environment of an industrial process. Such systems may include the electronics associated with emergency-stop buttons, light curtains, and other machine lockouts. Safety industrial control systems are not optimized for "availability", that is being able to function for long periods of time without error, but rather for "safety" which is being able to accurately detect an unsafe operating condition and shut down. Safety industrial controllers normally provide a predetermined safe state for their outputs upon a safety shutdown, the predetermined values of these outputs being intended to put the industrial process into its safest static mode.

Safety industrial control systems may be associated with a "safety integrity level" (SIL) indicating a given amount of risk reduction. Standard IEC EN 61508 defines four SIL levels of SIL-1 to SIL-4 with higher numbers representing higher amounts of risk reduction.

Industrial controllers that are part of a system providing SIL-2 and higher normally use diagnostic programs that run concurrently with the industrial controller to diagnose the operation of the hardware of the industrial controller to ensure that it is working correctly.

Safety industrial control systems providing SIL-3 and higher preferably provide "full redundancy" in hardware, for example, using two different industrial controllers having separate microprocessors, memory systems, communication systems and the like. In such full redundancy systems, the industrial controllers execute in parallel and their results are compared. If these results do not match, a "safety fault" can be indicated, causing the control system to move to the safe state.

As is known to those skilled in the art, one aspect of reaching a desired SIL safety rating is to verify operation of components within the system and to detect the failure of a component. Comparison of the redundant hardware allows an industrial controller to detect differences between each set of hardware. Under normal operation, each path in the redundant hardware operates in the same manner and generates the same output. If the controller detects a difference between the two paths, the difference indicates that one of the paths is not operating normally and has experienced a failure. The industrial controller may then bring the controlled machine or process to a safe state and provide an indication of the detected failure.

However, detecting failures in redundant paths is not without certain challenges. A pair of analog input signals generated, for example, by a pair of sensors are transmitted via a conductor or pair of redundant conductors and received at an input module or at redundant input modules. The pair of signals may be filtered and converted from an analog signal to a digital signal and then provided as digital values to a processor in the input module. While the two digital values may be compared, a difference between the two values indicates only that there is a fault at some location between the sensors and the processor in the input module. A technician must conduct further investigation of the sensors, the conductors, and the input module to identify the source of the fault prior to being able to correct the fault.

Thus, it would be desirable to provide an improved system and method of identifying a specific location of a fault in a redundant signal path.

In certain applications, an analog signal may be constant for an extended period of time, such as days or weeks. Certain process lines may, for example, run at a constant temperature or pressure and a sensor used to monitor the temperature or pressure receives a generally constant voltage signal corresponding to this temperature or pressure. The temperature or pressure may change only at a switchover to a new part, new recipe, or for periodic maintenance. The potential exists, however, that an electronic component in the signal path may fail during the extended period of time at which the signal remains a constant value. If the electronic component is, for example, one element of a filter in the signal path, the component may only impact transient, or changing, signals along the signal path and may have no impact on a constant value, such as the signal indicative of a constant temperature or pressure. The electronic component may remain failed for some time until there is a change in the input signal without detection of the failed component.

Thus, it would be desirable to provide an improved system and method for detecting failed electronic components in a redundant signal path without dependence on the state of the input signal.

BRIEF DESCRIPTION

According to one embodiment of the invention, a safety-rated input module includes at least one input terminal to receive an input signal, a first filter connected to the at least one input terminal to receive the input signal as an input to the first filter, and a second filter connected to the at least one input terminal to receive the input signal as an input to the second filter. The first filter and the second filter are connected in parallel. The safety-rated input module also includes a processor operative to receive a first filtered input signal from the first filter, receive a second filtered input signal from the second filter, and generate a test signal at a predefined frequency. The test signal is injected into the first filter, and a first frequency response of the first filter is determined as a function of the test signal. The test signal is injected into the second filter, and a second frequency response of the second filter is determined as a function of the test signal. A failure in either the first filter or the second filter is identified as a function of the first frequency response and of the second frequency response.

According to another embodiment of the invention, a safety-rated input module includes at least one input terminal to receive an input signal, a first signal path connected to the at least one input terminal to receive the input signal as an input to the first signal path, and a second signal path connected to the at least one input terminal to receive the input signal as an input to the second signal path. The first signal path and the second signal path are connected in parallel. A processor is operative to receive the input signal via the first signal path, receive the input signal via the second signal path, and generate a test signal at a predefined frequency. The test signal is injected into the first signal path, and a first frequency response of the first signal path is determined as a function of the test signal. The test signal is injected into the second signal path, and a second frequency response of the second signal path is determined as a function of the test signal. A failure in either the first signal path or the second signal path is identified as a function of the first frequency response and of the second frequency response.

According to still another embodiment of the invention, a method for testing a safety-rated input module in an industrial controller includes receiving an input signal via at least one input terminal on the input module, transmitting the input signal to a processor module in the industrial controller via at least a first signal path and a second signal path, and executing a control program in the processor module as a function of the input signal. The input module is further configured to execute the following steps while the processor module is executing the control program. The input module generates a test signal at a predefined frequency and alternately injects the test signal into the first signal path and the second signal path. A first frequency response of the first signal path is determined as a function of the test signal, and a second frequency response of the second signal path is determined as a function of the test signal. A failure in either the first signal path or the second signal path is identified as a function of the first frequency response and of the second frequency response.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

Figure 1:
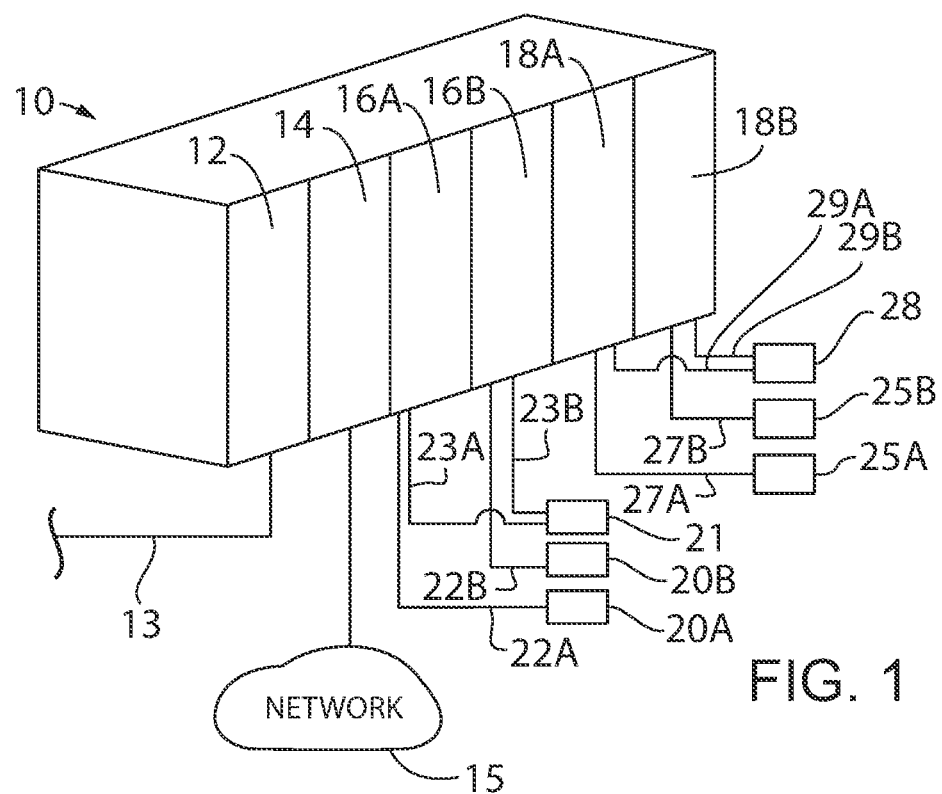
FIG. 1 is an environmental view of an exemplary industrial controller incorporating one embodiment of the present invention.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION

The various features and advantageous details of the subject matter disclosed herein are explained more fully with reference to the non-limiting embodiments described in detail in the following description.

A system and method for identifying a specific location of a fault along a redundant signal path is disclosed. More specifically, detection of the fault within a filter connected in series along the signal path defines a specific location of the fault. Providing an indication of the detected fault alerts a technician to a particular element or subsystem along the signal path requiring repair or replacement. The redundant signal path includes at least a first signal path and a second signal path. The electronic components used in each signal path are the same, such that performance of each signal path is the same. A signal entering either the first or second signal path results in an identical signal, within manufacturing tolerances of the electronic components, at the corresponding outputs of each signal path.

In order to achieve a desired SIL safety rating, an application may require an input signal to be transmitted along a first and a second signal path. The application may further require detection of a fault condition during operation of the redundant paths. In other words, the input module must test for correct operation of each signal path while the input signal is also being conducted by the redundant paths. An input module in the industrial controller receives the input signal at either a single input terminal or, optionally, receives redundant signals at a first input terminal and a second input terminal. The input signal(s) are transmitted along the first and second conduction paths. A processor in the input module is configured to generate a test signal at a predefined frequency. According to one aspect of the invention, the predefined frequency is selected as the crossover frequency of the filter under test. The processor is configured to inject the test signal into one of the signal paths at a time. The processor generating the test signal is also configured to receive the input signal from the redundant signal path. As the processor is injecting the test signal along one signal path, the processor receives the input signal, by itself, along the other signal path. Along the signal path under test, the test signal may be superimposed upon the input signal. Optionally, it is also contemplated that one or more electronic switching devices, such as a transistor, may be controlled to temporarily disconnect the signal path from the input signal and the test signal is transmitted by itself. The processor receives the test signal output from the filter, either by itself or superimposed on the input signal, and as attenuated by the filter. The processor then generates a frequency response of the signal output from the filter with respect to the original test signal to determine operation of the filter. After obtaining a frequency response for one of the signal paths, the process is repeated for the other signal path. Because the first and second signal paths are constructed identical to each other, the frequency response of the first signal path should match the frequency response of the second signal path. If there is a difference between the first frequency response and the second frequency response that exceeds an allowable amount, then the processor detects that a failure has occurred in one of the two filters present along the respective signal path.

Turning initially to FIG. 1, an exemplary industrial controller 10 incorporating one embodiment of the present invention is illustrated. The industrial controller 10 may be configured as a safety controller and include redundant modules 16, 18 and other hardware configuration according to a desired safety rating. The illustrated industrial controller 10 includes a power supply module 12 with a power cable 13 connected to a suitable power source, such as the utility grid. A processor module 14 includes at least one processor 30 (see also FIG. 2) configured to execute a control program 35. Optionally, the processor module 14 may include multiple processors, arranged in a redundant manner; multiple processors, each configured to execute a dedicated processing task; multiple cores on a single processor chip, each core arranged in a redundant manner or to execute a dedicated processing task; or a combination thereof. The processor module 14 is illustrated as being connected to a network 15. It is contemplated that the network may be an Ethernet network, an industrial network, a standard network, a proprietary network, an external network, an internal network, a wired network, a wireless network, or any combination thereof. The network 15 may connect the processor module to an operator interface, a programming terminal, remote racks, or the like. Optionally, the industrial controller 10 may also include a dedicated network module (not shown) configured to connect to the network 15 and provide an interface between the processor module 14 and the network 15.

A first input module 16A and a second input module 16B are provided in a redundant manner. The first input module 16A is connected to a first set of input devices 20A, and the second input module 16B is connected to a second set of input devices 20B. Optionally, the first and second input modules 16A, 16B may each be connected in a redundant manner to a third set of input devices 21. The input devices 20A, 20B, or 21 may be, for example, a switch, a sensor, a relay, or the like configured to generate an input signal for the industrial controller 10. A single block is provided for ease of illustration of each set of input devices 20A, 20B, or 21. However, it is contemplated that numerous input devices 20A, 20B, or 21 may be located around the controlled machine or process. A first output module 18A and a second output module 18B are provided in a redundant manner. The first output module 18A is connected to a first set of output devices 25A, and the second output module 18B is connected to a second set of output devices 25B. Optionally, the first and second output modules 18A, 18B may each be connected in a redundant manner to a third set of output devices 28. Each output device 28 in the third set of output devices may include, for example, redundant inputs, where each redundant input receives one of the output signals 29A, 29B and the output device 28 verifies that the redundant input signals are the same before the output device 28 responds to the output signal. The output devices 25A, 25B, or 28 may be, for example, a valve, a switch, a solenoid, or other actuator configured to perform a desired control operation of the controlled machine or process according to the output signal from the industrial controller 10. A single block is provided for ease of illustration of each set of output devices 25A, 25B, or 28. However, it is contemplated that numerous output devices 25 A, 25B, or 28 may be located around the controlled machine or process.

Figure 2:
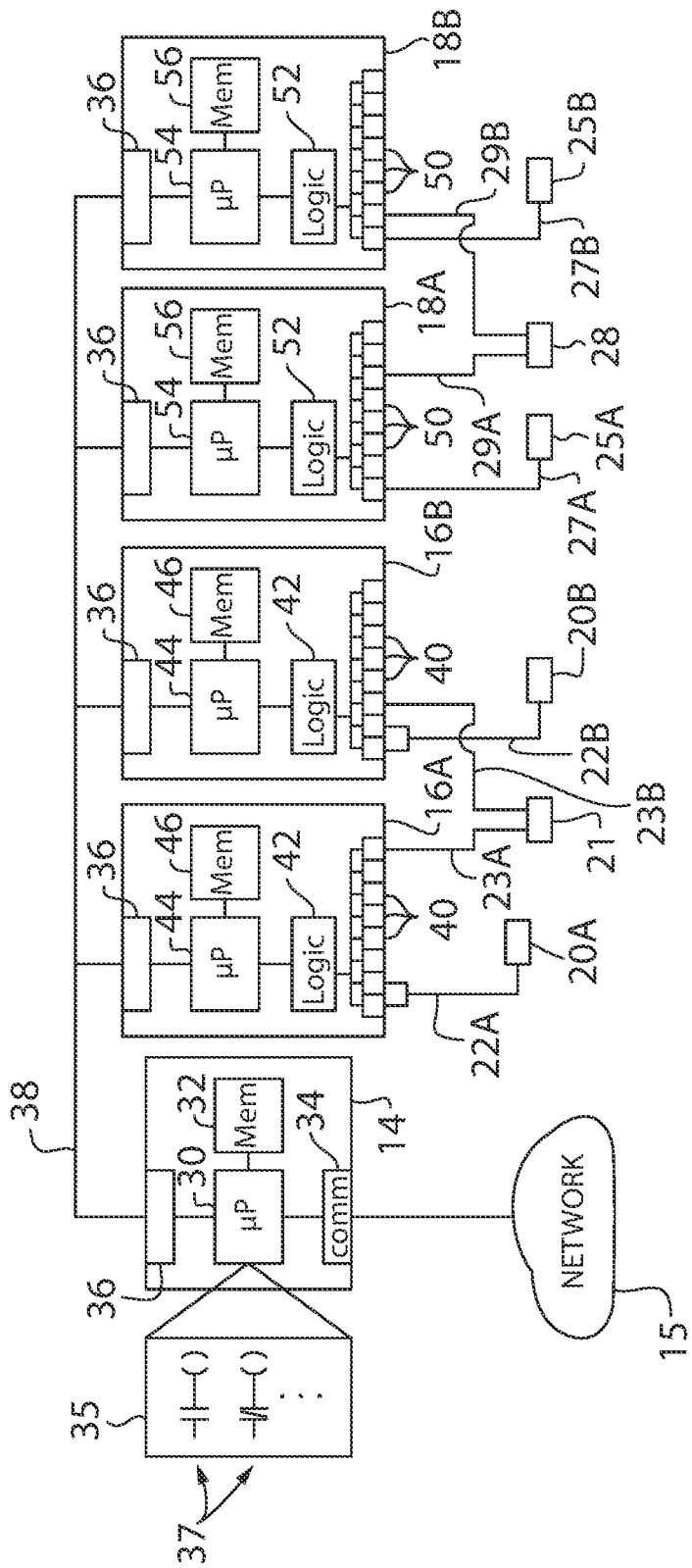
FIG. 2 is a partial block diagram representation of the industrial controller of FIG. 1.

Turning next to FIG. 2, the industrial controller 10 of FIG. 1 is illustrated, at least in part, in block diagram form. The processor module 14 includes at least one processor 30 in communication with memory 32. The memory 32 may be a single device or multiple devices and may include volatile memory, non-volatile memory, or a combination thereof. The memory 32 stores a control program 35 configured to be executed by the at least one processor 30. The control program includes a series of instructions which examine the present state of input signals to generate output signals. As is known in the art, the control program 35 may consist of ladder logic, where each rung 37 is executed sequentially to generate desired output signals. Optionally, the control program 35 may include a set of instructions from any suitable language to implement control of the industrial controller 10. The processor module 14 further includes a communication interface 34 configured to connect to the network 15, and a backplane connector 36 configured to connect to a backplane 38, where the backplane 38 extends between modules in the industrial controller 10 to provide communication between modules. Optionally, still additional communication ports may be included on one or more of the modules, where a dedicated communication cable may be connected between modules for communication.

Each input module 16 includes a set of input terminals 40, each input terminal 40 configured to be connected to and receive an input signal 22 from one of the input devices 20. A logic circuit 42 is connected between the input terminals 40 and a processor 44 within the input module 16. The logic circuit 42 may perform some initial processing, such as filtering or converting an analog input signal to a digital signal, before passing the input signal 22 to the processor 44. It is contemplated that the processor 44 may be a single processing unit executing on a single die; multiple processing units, each executing on separate dies; multiple processing units executing on a single die, or combinations thereof. The processor 44 is in communication with memory 46 in the input module 16. The memory 46 may be a single device or multiple devices and may include volatile memory, non-volatile memory, or a combination thereof. The memory 46 may include a series of instructions for execution by the processor 44. The memory 46 may also store values of the input signal 22 for subsequent transmission to the processor module 14. Each input module 16 includes a backplane connector 36 configured to connect to the backplane 38 for communication between modules.

According to the illustrated embodiment, each input device 20, 21 is connected to a pair of terminals 40 with the input signal 22, 23 from the input device being connected to a first input terminal and a second input terminal. According to one aspect of the invention, the input devices 20 may be paired devices, as shown, with a first input device 20A paired to a second input device 20B. A first input signal 22A from a first sensor 22A is run to a first terminal 40 and a second input signal 22A is run to a second terminal. The first input signal 22A is compared to the second input signal 22B by the processor 44 to verify that both input signals 22A, 22B are the same. Optionally, both paired input devices (20A, 20B) may each have their respective input signal 22A, 22B connected to a pair of input terminals 40 and the redundant input signals may be utilized in order to achieve a desired safety rating according to the application requirements. According to another aspect of the invention, a single input device 21 may provide redundant input signals 23A, 23B to two different input modules 16A, 16B. The redundant input modules 16A, 16B are in communication with each other, either via the backplane 38 or via a dedicated communication interface. One or both of the input modules 16A, 16B may be configured to compare the redundant input signals 23A, 23B to verify correct operation. As may be observed in FIG. 2 and as will be discussed in more detail in FIGS. 3-5, it is contemplated that redundant signal paths may be established in many different configurations without deviating from the scope of this invention.

Each output module 18 includes a set of output terminals 50, each output terminal 50 configured to be connected to and send an output signal 27 to one of the output devices 25. A logic circuit 52 is connected between the processor 54 and the output terminals 50 within the output module 18. The logic circuit 52 may perform some processing, such as splitting an output signal to paired output terminals or converting a digital value to an analog signal, before transmitting the output signal 27 form the processor 54 to the output device 25. The processor 54 is in communication with memory 56 in the output module 18. The memory 56 may be a single device or multiple devices and may include volatile memory, non-volatile memory, or a combination thereof. The memory 56 may include a series of instructions for execution by the processor 54. The memory 56 may also store values of the output signal 27 for subsequent use by the processor 54 or by the processor module 14. Each output module 18 includes a backplane connector 36 configured to connect to the backplane 38 for communication between modules.

Figure 3:
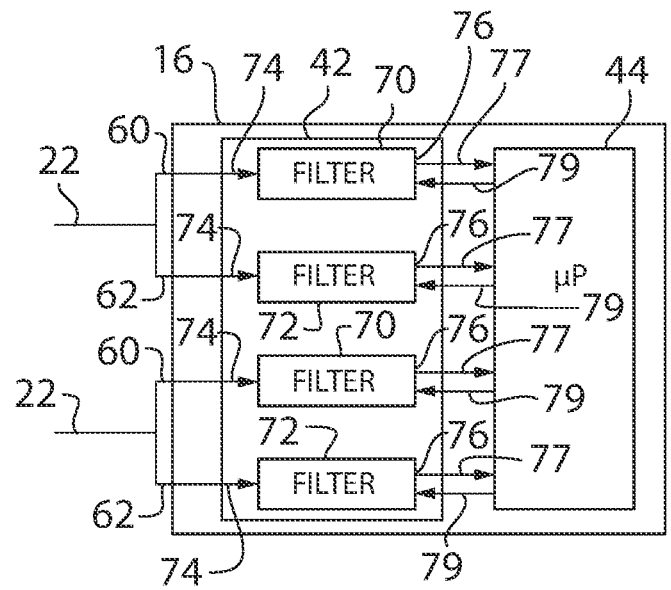
FIG. 3 is a partial block diagram representation of one embodiment of redundant signal paths for an input module used in the industrial controller of FIG. 1.

Turning next to FIG. 3, a portion of the logic circuit 42 for one embodiment of redundant signal paths established in a single input module 16 is shown in additional detail. Each input signal 22 is connected to a redundant signal path. According to the illustrated embodiment, the input signals 22 are each connected to a pair of input terminals 40. The first terminal to which an input signal 22 is connected defines, at least in part, a first signal path 60, and the second terminal to which an input signal 22 is connected defines, at least in part, a second signal path 62. The first signal path 60 and the second signal path 62 are each connected within the input module 16 to the logic circuit 42. Within the logic circuit 42, a first filter 70 is connected in series in the first signal path 60, and a second filter 72 is connected in series in the second signal path 62. Each filter 70, 72 may be configured according to the application requirements; however, the first filter 70 for each first signal path 60 is configured in the same manner as the corresponding second filter 72 in the second signal path 62 for the same input signal 22. The filter 70, 72 may be, for example, a low-pass filter, a band-pass filter, a notch filter, or a high-pass filter. It is contemplated that the filter may be a first-order filter, second-order filter, or still other configurations of a filter. For purpose of illustration herein and without limitation to the scope of the invention, the filters 70, 72 will be discussed as a second order, low-pass filter. The output 76 of each filter 70, 72 are connected to a processor 44 for comparison between the input signals and for measurements of the input signal.

Figure 4:
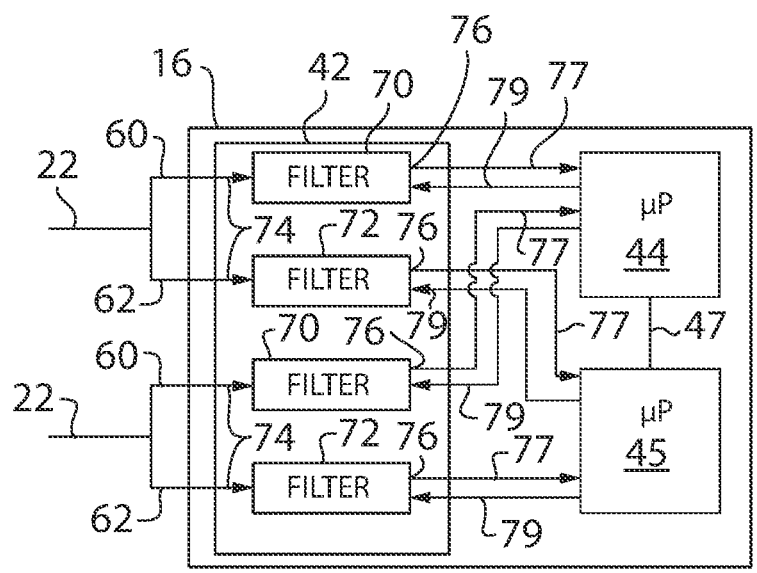
FIG. 4 is a partial block diagram representation of another embodiment of redundant signal paths for an input module used in the industrial controller of FIG. 1.
Figure 5:
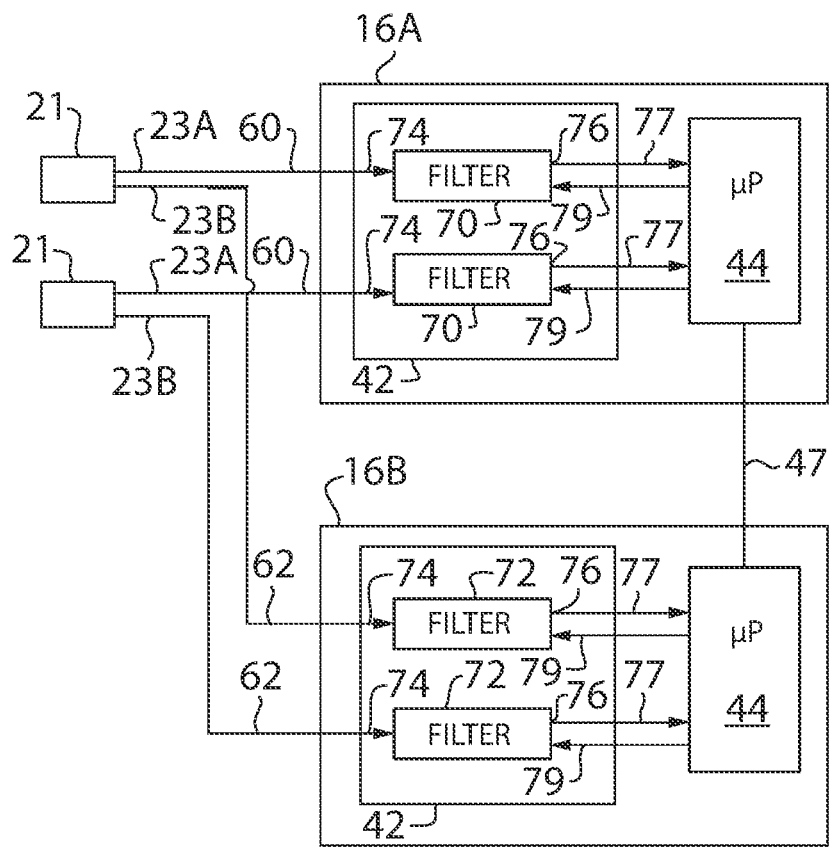
FIG. 5 is a partial block diagram representation of still another embodiment of redundant signal paths for a pair of input modules used in the industrial controller of FIG. 1.
Figure 6:
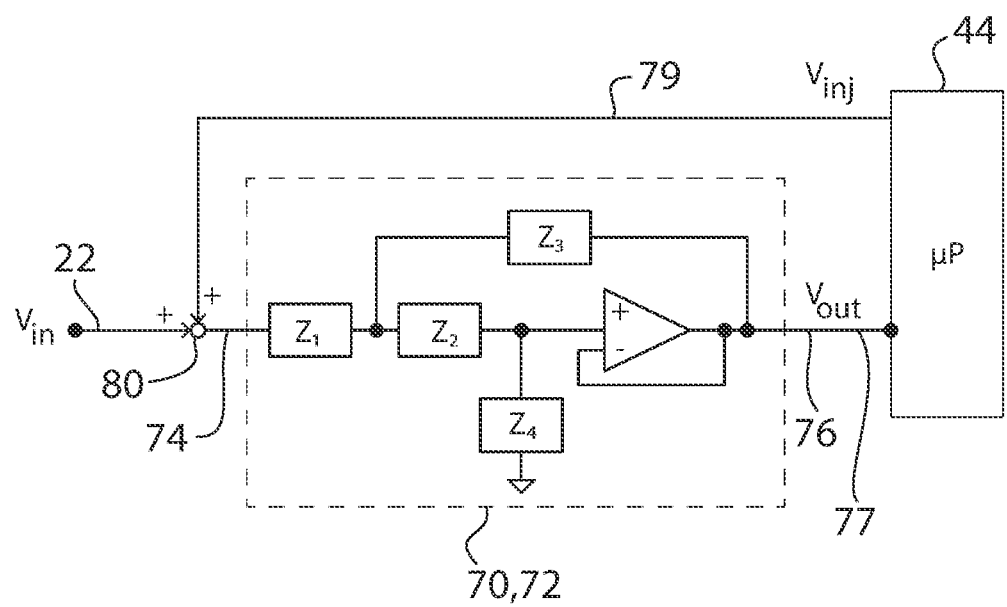
FIG. 6 is a block diagram representation of one embodiment of a filter present in one of the redundant signal paths of FIGS. 3-5.
Figure 7:
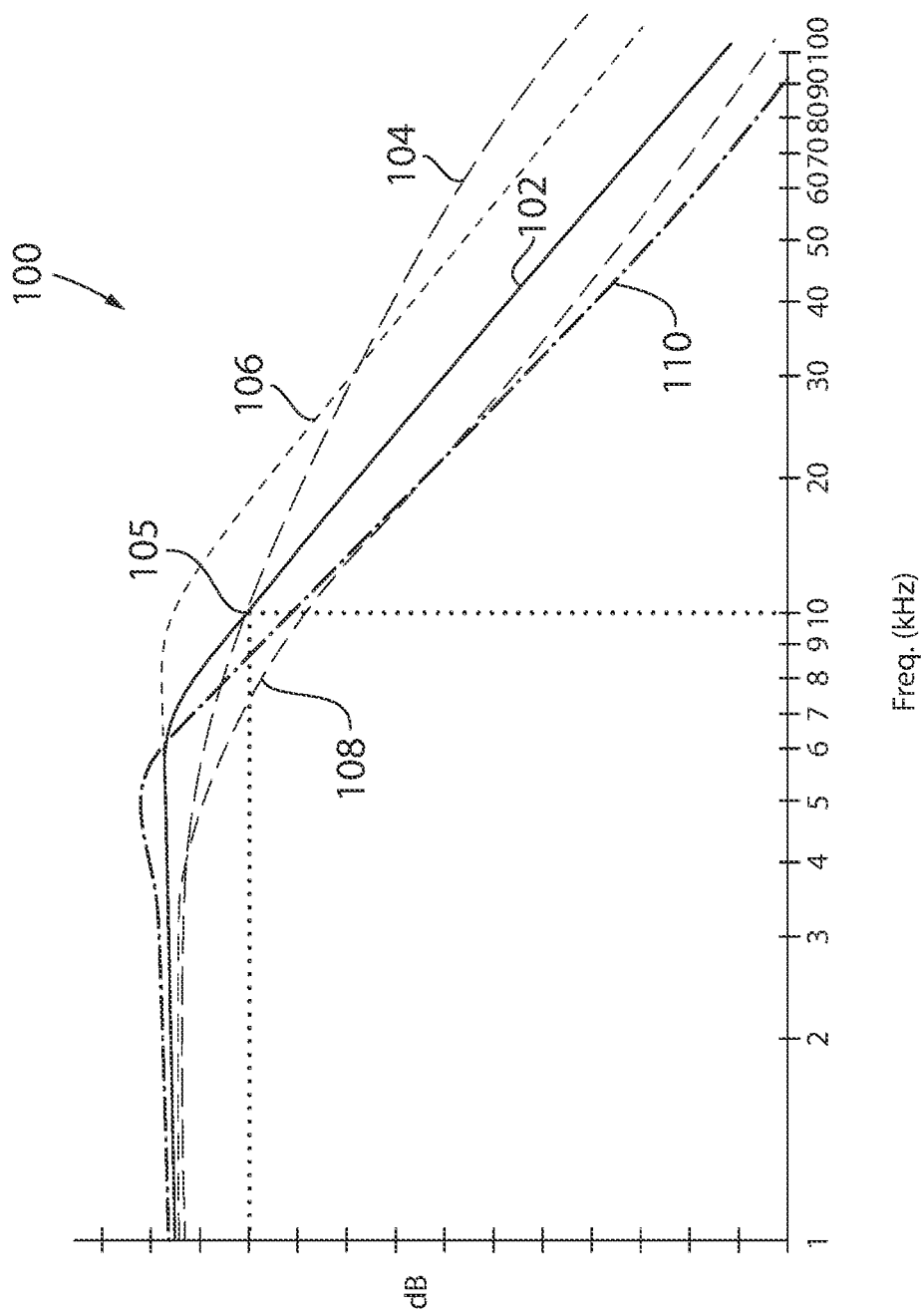
FIG. 7 is a graphical representation of frequency responses obtained across the filter of FIG. 4.

If a higher SIL rating and improved diagnostic coverage is desired, the processor 44 may be split into two processors 44, 45 with the output the first filter 70 provided to a first processor 44 and the output of the second filter 72 provided to a second processor 45. The processors 44, 45 may communicate with each other via the backplane 38 or may have a dedicated communication 47 interface established between the two processors. Turning next to FIGS. 4 and 5, two exemplary embodiments of redundant signal paths established to separate processors are illustrated.

In FIG. 4, a single input module 16 includes redundant processors. Similar to FIG. 3, the input signals 22 are each connected to a pair of input terminals 40. The first terminal to which an input signal 22 is connected defines, at least in part, a first signal path 60, and the second terminal to which an input signal 22 is connected defines, at least in part, a second signal path 62. The first signal path 60 and the second signal path 62 are each connected within the input module 16 to the logic circuit 42. Within the logic circuit 42, a first filter 70 is connected in series in the first signal path 60, and a second filter 72 is connected in series in the second signal path 62. Each filter 70, 72 may be configured according to the application requirements; however, the first filter 70 for each first signal path 60 is configured in the same manner as the corresponding second filter 72 in the second signal path 62 for the same input signal 22. However, instead of the output 76 of each filter 70, 72 being connected to a single processor 44 as shown in FIG. 3, the output 76 of the first filter 70 for each first signal path 60 is connected to a first processor 44, and the output 76 of the second filter 72 for each second signal path 62 is connected to a second processor 45. A dedicated communication interface 47 is provided between processors 44, 45 and may be, for example, a communication bus on a circuit board to which both processors 44, 45 are mounted.

In FIG. 5, a pair of input modules 16A, 16B provided the redundant processors. According to the illustrated embodiment, the third set of input devices 21 are shown with each input device providing a first input signal 23A to a first input module 16A and a second input signal 23B to a second input module 16B. It is contemplated that the first and second sets of input devices 20A, 20B may similarly generate first and second input signals 22A, 22B for the first and second input modules 16A, 16B, respectively. The first input signal 23A from each input device 21 defines, at least in part, a first signal path 60, and the second input signal 23B from each input device 21 defines, at least in part, a second signal path 62. The first signal path 60 and the second signal path 62 are each connected within the respective input modules 16A, 16B to the corresponding logic circuit 42. Within the logic circuit 42 of the first input module 16A, a first filter 70 is connected in series in the first signal path 60, and within the logic circuit 42 of the second input module 16B, a second filter 72 is connected in series in the second signal path 62. Each filter 70, 72 may be configured according to the application requirements; however, the first filter 70 for each first signal path 60 is configured in the same manner as the corresponding second filter 72 in the second signal path 62 for the same pair of input signals 23A, 23B. The output 76 of each first filter 70 is provided to the processor 44 in the first input module 16A, and the output 76 of each second filter 70 is provided to the processor 44 in the second input module 16B. A dedicated communication interface 47 is provided between processors 44 and may be, for example, the backplane 38, a dedicated communication link, or an industrial network 15 connected between input modules.

With reference also to FIG. 4, each filter 70, 72 receives the input signal 22 at an input 74 of the filter. The impedances ($Z_1$-$Z_4$) of the filter 70, 72 are selected to achieve a desired performance of the filter. For convenience and without being limiting, the discussion of the illustrated filter 70, 72 will be with respect to a low-pass filter with a cutoff frequency at about ten kilohertz (10 kHz). It is understood that the filter may be of various configurations and configured to operate at various frequencies according to the application requirements. The input signal 22 passes through the filter 70, 72 and undesired electrical components present on the input signal 22 are attenuated according to the characteristics of the filter. The filtered signal is present at the output 76 of the filter. The filtered signal is then used according to the application requirements. It is contemplated the logic circuit 42 may include still additional processing such as analog-to-digital conversion to convert the analog input signal into a digital value which is received at the processor 44. Optionally, the logic circuit 42 may include comparators, summers, or the like and perform additional processing on the filtered signal prior to providing the signal to the processor.

The processor 44 may also be configured to supply a test signal 79 and/or control signals to the filters 70, 72. The test signal 79 may be added to the input signal 22 at a summing junction 80 at the input 74 of the filter. It is contemplated that the test signal will be at least one periodic or pulsed signal at a desired frequency. The desired frequency maybe selected according to the characteristics of the filter 70, 72 being evaluated. For the low-pass filter with a cutoff frequency at about ten kilohertz, the desired frequency may be ten kilohertz. Optionally, the test signal may include multiple frequencies. To evaluate operation, for example, of the pass-band and stop-band regions of the filter, additional frequencies such as one kilohertz (1 kHz) and one hundred kilohertz (100 kHz) may be selected in addition to the ten kilohertz frequency. At least one complete cycle of a test signal 79, such as a sinusoidal signal, at each of the desired frequencies may be generated and injected into each filter 70, 72 to evaluate operation of the filter. In some applications, it may be desirable to disconnect the input signal 22 from the filter 70, 72 as the test signal 79 is injected into the filter. A control signal may be generated by the processor 44 which is provided to an electrical switch, such as a transistor, to disconnect the input signal 22 from the input 74 of the filter as the test signal 79 is applied. Similarly, the output 76 of the filter 70, 72 may be connected to additional processing within the logic circuit 42 to a common input with the other signal path in the redundant signal path or the like and it may be desirable to disconnect the output 76 of the filter 70, 72 from the additional processing to prevent the test signal 79 from passing through or cross-coupling with the additional processing. Another control signal may be generated from the processor 44 and provided to an electrical switch, such as a transistor, to disconnect the output 76 of the filter 70, 72 from the additional processing as the test signal 79 is applied to the filter 70, 72.

In order to achieve a desired safety rating, it is desirable to detect a failure in the system soon after it occurs and, preferably, prior to a second failure that could render the redundant signal path inoperative. In some applications, the analog input signal 22 provided to the input module 16 changes frequently. The analog input signal may, for example, be used to detect the amount of a product as the product is inserted within packaging. The signal may be generated by a scale, a level sensor, a pressure sensor, or other sensor detecting the presence of the product as the package is filled. When the input signal corresponds to a desired fill level, a new package is delivered to a fill station and the process repeats. In other applications, the analog input signal 22 provided to the input module 16 may remain generally constant. The analog input signal may, for example, be used to measure temperature in a commercial oven where product passes through the commercial oven for curing and it is desired that the temperature remain substantially constant. In those applications where the analog input signal changes frequently, the input module 16 could be configured to utilize the analog input signal 22 as a test signal, monitoring the input signal at the input of a filter 70, 72 and monitoring the filtered output to determine a frequency response of the filter. However, a varying analog input signal may not include electronic components at all of the desired frequencies of interest. Further, in those applications where the analog input signal remains generally constant, the redundant signal paths may be compared to each other to verify the direct current (DC) level of the analog signal; however, operation of the filter 70, 72 cannot be verified. Failure of an electronic component, such as a resistor or capacitor which define the impedances ($Z_1$-$Z_4$) in the filter 70, 72 impact the dynamic response of the filter. While some failures may be detected with a variable analog signal, the failure may be frequency dependent and not all failures may be detected. Similarly, a constant, DC value of an analog signal passing through the filter 70,72 has no dynamic content and it is not possible to detect failure of many of the electronic components within the filter.

In operation, the processor 44 in the input module 16 may be configured to test operation of the filters 70, 72 within the redundant signal paths in real-time without disrupting operation of the input module 16. Both the first signal path 60 and the second signal path 62 are receiving the input signal 22. The processor 44 generates a test signal 79 used to verify operation of the filter 70, 72 in the corresponding signal path 60, 62. In order to allow operation of the industrial controller 10 to continue without interruption during the test, the processor 44 is configured to test one of the signal paths 60, 62 at a time, and the input signal 22 is continuously conducted through the other of the redundant signal paths to the processor 44. Initially, the processor 44 may generate a test signal 79 and inject the test signal into the first signal path 60. The input signal 22 is conducted through the second signal path 62 without the presence of a test signal. The processor 44 measures the output 76 of the first filter 70 and determines a frequency response of the first filter 70 as a function of the test signal and the output signal from the first filter. The processor 44 stops injection of the test signal 79 along the first signal path 60 and may then begin injection of the test signal 79 along the second signal path 62. The input signal 22 is conducted through the first signal path 60 without the presence of a test signal. The processor 44 measures the output 76 of the second filter 72 and determines a frequency response of the second filter 72 as a function of the test signal and the output signal from the second filter. The electronic components selected for each filter 70, 72 have a nominal value and an expected resultant performance. As a result, the frequency response determined for the first filter 70 should match the frequency response determined for the second filter 72 within manufacturing tolerances for each of the components. Allowing for some variation due, for example, to manufacturing tolerances or measurement resolution, the first frequency response is compared to the second frequency response. If the amplitude of the first frequency response differs from the amplitude of the second frequency response beyond a predefined threshold, the processor 44 identifies a failure in either the first filter 70 or the second filter 72. The processor 44 in the input module 16 may transmit a signal to the processor module 14 via the backplane 38 such that the control program 35 executing in the processor module 14 is aware of the failure and may take any required action to put the controlled machine or process into a safe operating state and/or to notify a technician of the failure.

The test signal is generated at a desired frequency, where the desired frequency may be selected according to the characteristics of the filter 70, 72 being evaluated. The electronic components selected for the filter have a nominal value and an expected resultant performance. For a low-pass filter, one operating point at which the filter may be tested is the cutoff frequency. When a signal is input to the filter 70, 72 at the cutoff frequency, the filter 70, 72 attenuates the input signal 22 by three decibels (3 dB). A three-decibel attenuation of the input signal 22 reduces the amplitude of the signal by a factor of one over the square root of two, or by a factor of about 0.707. At this amplitude, the attenuation of the filter 70, 72 is evident, yet the magnitude of the signal is still sufficient that variations in the magnitude are readily apparent.

With reference also to FIG. 5, a graphical representation 100 of the performance of a filter 70, 72 connected in one of the signal paths is illustrated. A baseline plot 102 corresponding to expected operation of the filter is illustrated. An operating point 105 is shown which corresponds to the cut-off frequency. Four additional plots 104, 106, 108, 110 are also shown which demonstrate exemplary operation of the filter 70, 72 where at least one of the electronic components which comprise the filter have failed, either entirely or partially such that the actual resistance or capacitance of the component is outside of the expected manufacturing tolerances for the corresponding component. Comparison of the amplitude of the frequency response at the operating point 105 demonstrates a difference in the amplitude of the frequency response for the baseline plot 102 in comparison to the amplitudes of the four additional plots 104, 106, 108, 110.

According to one aspect of the invention, a baseline frequency response 102 may be stored in memory 46 and accessed by the processor 44 of the input module. The baseline frequency response may be determined according to the nominal values of components present in the filter 70, 72 at manufacture of the input module 16. Optionally, a baseline frequency response 102 may be determined during a commissioning process of the input module 16. An initial frequency response of the filter 70, 72 may be measured and stored in memory 46 such that the baseline frequency response 102 corresponds to the actual values of the electronic components used in the filters 70, 72 of each input module 16.

The baseline frequency response 102 may be utilized to detect a second fault condition. As discussed above, the processor 44 is configured to sequentially inject the test signal in each signal path of the redundant signal paths. The frequency response obtained from a first signal path is compared to the frequency response obtained from a second signal path. If a difference between the first and second frequency responses exceeds a first predefined threshold, this indicates an error occurred in one of the two filters 70, 72 along the respective signal paths. However, if both filters 70, 72 experience a common failure mode, for example, by an unexpected input signal damaging both filters 70, 72 in a similar manner, a comparison of the two frequency responses may be unable to detect the failure in both filters 70, 72. Thus, the processor 44 may be further configured to compare the first frequency response and the second frequency response to a baseline frequency response. The baseline frequency response may have been stored during manufacture or during commissioning of the input module 16. If the difference between the first frequency response or the second frequency response and the baseline frequency response exceeds a second predefined threshold, the processor 44 identifies a failure in the filter 70, 72 corresponding to the frequency response which varies from the baseline frequency response in an amount greater than the predefined threshold. It is contemplated that the second predefined threshold may be configured as an identical value or as a different value to the first predefined threshold. In addition to detecting a sudden change in both filters 70, 72, comparison of the first and second frequency responses to a baseline frequency response may be used to detect gradual changes in electronic component values over time.

It is contemplated that the processor 44 is configured to test operation of the redundant signal paths on a periodic basis. As previously discussed, certain applications generate a generally constant analog input signal to the input module 16. The processor 44 may generate the test signal and inject the test signal into each signal path periodically. The frequency at which the processor 44 generates the test signal may be defined by a parameter stored in memory 46 of the input module and may be configurable according to application requirements. It is contemplated that the test signal may be generated at an interval in a range, for example, from seconds to minutes or even daily. Each time the test signal is injected into each signal path, the processor 44 determines the frequency response and checks whether the filter 70, 72 in either signal path has failed. Consequently, the processor 44 may detect a failure in a signal path even in the presence of a constant input signal such that the processor 44 may take appropriate steps according to a desires safety level to put the controlled machine or process into a safe operating state.

In certain applications, it may be undesirable to have the input signal 22 conducted through the signal path as the signal path is being tested. Depending on the application requirements and on the design of the redundant signal paths, the potential exists for the injected test signal to be communicated or coupled to the signal path not presently being tested. One or more electronic switches may be operatively connected to each signal path. The electronic switch may be used to disconnect the input signal from the input to the filter when the test signal is being injected into the signal path. In certain applications, each signal path may be connected to a common connection, where cross-coupling via the common connection may occur and it may be desirable to disconnect the signal path from the common connection. It is understood that an electronic switch may be added in the signal path as needed to isolate one signal path from the other during injection of the test frequency.

For the low-pass filter with a cutoff frequency at about ten kilohertz, the desired frequency may be ten kilohertz. Optionally, the test signal may include multiple frequencies. To evaluate operation, for example, of the pass-band and stop-band regions of the filter, additional frequencies such as one kilohertz (1 kHz) and one hundred kilohertz (100 kHz) may be selected in addition to the ten kilohertz frequency. At least one complete cycle of a test signal 79, such as a sinusoidal signal, at each of the desired frequencies may be generated and injected into each filter 70, 72 to evaluate operation of the filter. The test signal at each frequency may be sequentially injected into the first signal path and a frequency response determined for the first signal path at each frequency. The test signal at each frequency may then be sequentially injected into the second signal path and a frequency response determined for the second signal path at each frequency. The frequency response for the first signal path is compared to the frequency response for the second signal path at each frequency. A failure in the filter 70, 72 in one of the signal paths may be identified when a difference between the frequency response for the two signal paths at any one of the test frequencies is detected. Injecting a signal at multiple frequencies may be particularly useful when, for example, one signal path is operating normally and exhibits a frequency response similar to the base frequency response 102 illustrated in FIG. 5 and the other signal path had experienced a failure resulting in a frequency response similar to that illustrated by plot 104 in FIG. 5. Although the shape of the frequency responses 102 and 104 are substantially different, the magnitudes of the frequency responses are fairly consistent at one kilohertz (1 kHz) and at ten kilohertz (10 kHz). The difference at this frequency in the pass band and at the cutoff frequency may not be sufficient to exceed a predefined threshold and, therefore, a failure would go unnoticed. However, the magnitudes of the frequency responses 102 and 104 at one hundred kilohertz (100 kHz) in the stop band are substantially different and the processor 44 would identify a failure in the filter exhibiting the frequency response shown in plot 104.

The present invention has been discussed above with respect to a pair of redundant signal paths. The above invention is not intended to be limiting, but rather is utilized for convenience as one embodiment of the invention. The concepts discussed above could be applied to more than two redundant signal paths as well. The test signal may be sequentially injected into a first signal path, a second signal path, a third signal path, and any additional signal paths. Comparison between signal paths may still identify a difference between signal paths indicating that a filter in at least one of the signal paths has failed.

In some applications, three signal paths may be configured for redundant operation. Operation may be allowed to continue if at least two out of the three signal paths are operating correctly. As an initial check, the signal paths may be compared to each other. If the frequency response for all three paths is the same, it is likely that all three paths are operating properly. However, the potential exists that each of the three signal paths experienced a common failure and are each operating in the same manner, but erroneously. If the signal paths are not only compared to each other, but also compared to a baseline frequency response, the processor 44 may detect such a failure. Further, the initial check indicates that at least one of the signal paths has failed the processor 44 may compare the frequency response from one of the two signal paths that match to the baseline frequency response. The processor 44 can then determine whether the two matching signal paths are operating properly or whether two signal paths have failed and only a single path is operating properly. The processor 44 in the input module 16 may generate reporting messages accordingly and transmit the messages to the processor module 14 such that a control program executing on the processor module may put the controlled machine or process into a safe operating state if necessary.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

We claim:

1. A safety-rated input module, comprising:
at least one input terminal to receive an input signal;
a first filter connected to the at least one input terminal to receive the input signal as an input to the first filter;
a second filter connected to the at least one input terminal to receive the input signal as an input to the second filter, wherein the first filter and the second filter are connected in parallel; and
a processor operative to:
receive a first filtered input signal from the first filter,
receive a second filtered input signal from the second filter,
generate a test signal at a predefined frequency,
inject the test signal into the first filter,
determine a first frequency response of the first filter as a function of the test signal,
inject the test signal into the second filter,
determine a second frequency response of the second filter as a function of the test signal, and
identify a failure in either the first filter or the second filter as a function of the first frequency response and of the second frequency response.

2. The safety-rated input module of claim 1, wherein the processor is further operative to:
compare the first frequency response to the second frequency response, and
identify the failure in either the first filter or the second filter when a difference between the first frequency response and the second frequency response exceeds a predefined threshold.

3. The safety-rated input module of claim 1, wherein the processor is further operative to:
compare the first frequency response to a baseline frequency response stored in a memory of the input module,
compare the second frequency response to the baseline frequency response stored in the memory of the input module, and
identify the failure in either the first filter or the second filter when a difference between either the first frequency response or the second frequency response and the baseline frequency exceeds a predefined threshold.

4. The safety-rated input module of claim 1, wherein the processor is further operative to transmit either the first filtered input signal or the second filtered input signal to a processor module executing a control program in tandem with injecting the test signal into the first and second filters.

5. The safety-rated input module of claim 4, wherein the processor is operative to:
inject the test signal into the first filter while transmitting the second filtered input signal to the processor module, and
inject the test signal into the second filter while transmitting the first filtered input signal to the processor module.

6. The safety-rated input module of claim 1, wherein:
the at least one input terminal includes a first input terminal and a second input terminal,
the first filter is connected to the first input terminal, and
the second filter is connected to the second input terminal.

7. The safety-rated input module of claim 1, further comprising:
a first electronic switch configured to, at least in part, isolate the first filter responsive to a first control command generated by the processor, wherein the processor is further configured to isolate the first filter with the first control command when injecting the test signal into the first filter; and
a second electronic switch configured to, at least in part, isolate the second filter responsive to a second control command generated by the processor, wherein the processor is further configured to isolate the second filter with the second control command when injecting the test signal into the second filter.

8. A safety-rated input module, comprising:
at least one input terminal to receive an input signal;
a first signal path connected to the at least one input terminal to receive the input signal as an input to the first signal path;
a second signal path connected to the at least one input terminal to receive the input signal as an input to the second signal path, wherein the first signal path and the second signal path are connected in parallel; and
a processor operative to:
receive the input signal via the first signal path,
receive the input signal via the second signal path,
generate a test signal at a predefined frequency,
inject the test signal into the first signal path,
determine a first frequency response of the first signal path as a function of the test signal,
inject the test signal into the second signal path,
determine a second frequency response of the second signal path as a function of the test signal, and
identify a failure in either the first signal path or the second signal path as a function of the first frequency response and of the second frequency response.

9. The safety-rated input module of claim 8, wherein the processor is further operative to:
compare the first frequency response to the second frequency response, and
identify the failure in either the first signal path or the second signal path when a difference between the first frequency response and the second frequency response exceeds a predefined threshold.

10. The safety-rated input module of claim 8, wherein the processor is further operative to:
compare the first frequency response to a baseline frequency response stored in a memory of the input module,
compare the second frequency response to the baseline frequency response stored in the memory of the input module, and
identify the failure in either the first signal path or the second signal path when a difference between either the first frequency response or the second frequency response and the baseline frequency exceeds a predefined threshold.

11. The safety-rated input module of claim 8 further comprising:
a first filter connected in series with the first signal path between the at least one input terminal and the processor; and
a second filter connected in series with the second signal path between the at least one input terminal and the processor.

12. The safety-rated input module of claim 8, wherein:
the first signal path and the second signal path are both connected to a common input terminal,
the processor is further operative to disconnect the first signal path from the common input terminal when injecting the test signal into the first signal path, and
the processor is further operative to disconnect the second signal path from the common input terminal when injecting the test signal into the second signal path.

13. The safety-rated input module of claim 8, wherein:
the at least one input terminal includes a first input terminal and a second input terminal,
the first signal path is connected to the first input terminal, and
the second signal path is connected to the second input terminal.

14. A method for testing a safety-rated input module in an industrial controller, the method comprising the steps of:
receiving an input signal via at least one input terminal on the input module;
transmitting the input signal to a processor module in the industrial controller via at least a first signal path and a second signal path; and
executing a control program in the processor module as a function of the input signal, wherein the input module is further configured to execute the following steps while the processor module is executing the control program:
generating a test signal at a predefined frequency;
alternately injecting the test signal into the first signal path and the second signal path;
determining a first frequency response of the first signal path as a function of the test signal;
determining a second frequency response of the second signal path as a function of the test signal; and
identifying a failure in either the first signal path or the second signal path as a function of the first frequency response and of the second frequency response.

15. The method of claim 14, wherein the first signal path and the second signal path are both connected to a common input terminal, the method further comprising the steps of:
disconnecting the first signal path from the common input terminal when injecting the test signal into the first signal path; and
disconnecting the second signal path from the common input terminal when injecting the test signal into the second signal path.

16. The method of claim 14 further comprising the steps of:
transmitting the input signal to the processor module in the industrial controller via a third signal path;
alternately injecting the test signal into the first signal path, the second signal path, and the third signal path;
determining a third frequency response of the third signal path as a function of the test signal; and
continuing execution of the control program when at least two of the first frequency response, the second frequency response, and the third frequency response match.

17. The method of claim 14, wherein the test signal includes a plurality of predefined frequencies, the method further comprising the steps of:
generating the test signal at each of the plurality of predefined frequencies;

injecting the test signal into the first signal path at each of the plurality of predefined frequencies;

determining the first frequency response as a function of the test signal at each of the plurality of predefined frequencies;

injecting the test signal into the second signal path at each of the plurality of predefined frequencies; and determining the second frequency response as a function of the test signal at each of the plurality of predefined frequencies.

18. The method of claim 17 wherein:

the first signal path includes a first filter connected in series with the at least one input terminal, the second signal path includes a second filter connected in series with the at least one input terminal, each of the first and second filters includes a plurality of components, identifying the failure in either the first signal path or the second signal path further comprises identifying a failure in one of the plurality of components in either the first filter or the second filter as a function of the first frequency response or the second frequency response at each of the plurality of predefined frequencies.

19. The method of claim 14, wherein identifying the failure in either the first signal path or the second signal path further comprises the steps of:

comparing the first frequency response to the second frequency response, and identifying the failure in either the first signal path or the second signal path when a difference between the first frequency response and the second frequency response exceeds a predefined threshold.

20. The method of claim 14, wherein identifying the failure in either the first signal path or the second signal path further comprises the steps of:

comparing the first frequency response to a baseline frequency response stored in a memory of the input module;

comparing the second frequency response to the baseline frequency response stored in the memory of the input module; and identifying the failure in either the first signal path or the second signal path when a difference between either the first frequency response or the second frequency response and the baseline frequency exceeds a predefined threshold.

* * * * *